(12) United States Patent
Müller

(10) Patent No.: US 7,177,339 B2
(45) Date of Patent: Feb. 13, 2007

(54) SEMICONDUCTOR LASER

(75) Inventor: Jürgen Müller, Bernhardswald (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 180 days.

(21) Appl. No.: 10/637,191

(22) Filed: Aug. 8, 2003

(65) Prior Publication Data
US 2004/0032892 A1 Feb. 19, 2004

Related U.S. Application Data

(63) Continuation of application No. PCT/DE02/00471, filed on Feb. 8, 2002.

(30) Foreign Application Priority Data

Feb. 8, 2001 (DE) ................. 101 05 722

(51) Int. Cl.
H01S 3/08 (2006.01)
H01S 5/00 (2006.01)

(52) U.S. Cl. ................. 372/98; 372/43.01; 372/46.015

(58) Field of Classification Search ............ 372/43.01, 372/46.01, 46.015, 98
See application file for complete search history.

(56) References Cited

U.S. PATENT DOCUMENTS

| | | | |
|---|---|---|---|
| 5,245,622 A * | 9/1993 | Jewell et al. ............. 372/45.01 |
| 5,256,596 A * | 10/1993 | Ackley et al. ................. 438/39 |
| 5,258,316 A * | 11/1993 | Ackley et al. ................. 438/42 |
| 5,446,752 A * | 8/1995 | Ackley et al. ............ 372/46.01 |
| 5,493,577 A * | 2/1996 | Choquette et al. ............. 372/46 |
| 5,557,627 A * | 9/1996 | Schneider et al. ........ 372/50.12 |
| 5,719,891 A * | 2/1998 | Jewell .......................... 372/45 |
| 5,729,566 A * | 3/1998 | Jewell ......................... 372/96 |
| 5,812,577 A * | 9/1998 | Dawson et al. ......... 372/46.015 |
| 5,822,356 A | 10/1998 | Jewell |
| 5,881,085 A | 3/1999 | Jewell |
| 5,893,722 A * | 4/1999 | Hibbs-Brenner et al. ...... 438/45 |
| 5,903,590 A * | 5/1999 | Hadley et al. ................. 372/96 |
| 6,064,683 A * | 5/2000 | Johnson ................. 372/46.015 |
| 6,144,682 A | 11/2000 | Sun |
| 6,185,241 B1 * | 2/2001 | Sun .............................. 372/96 |
| 6,208,007 B1 * | 3/2001 | Babic et al. ................. 257/466 |
| 6,534,331 B2 * | 3/2003 | Liao et al. .................... 438/46 |
| 6,542,527 B1 * | 4/2003 | Gopinath ................. 372/45.01 |

(Continued)

OTHER PUBLICATIONS

Wu, Y. A. et al.: "High-Yield Processing and Single-Mode Operation of Passive Antiguide Region Vertical-Cavity Lasers", IEEE Journal of Selected Topics in Quantum Electronics, vol. 3, No. 2, Apr. 1997, pp. 429-434.

(Continued)

Primary Examiner—Jame Menefee
Assistant Examiner—Phillip Nguyen
(74) Attorney, Agent, or Firm—Laurence A. Greenberg; Werner H. Stemer; Ralph E. Locher

(57) ABSTRACT

A semiconductor laser has implantation regions that are effective as mode-selective regions in addition to current diaphragms in the edge region of a mesa. As a result, the inner opening of the current diaphragms can be chosen to be larger than in the prior art. This leads to a low ohmic and thermal resistance and enables a high output power.

12 Claims, 1 Drawing Sheet

U.S. PATENT DOCUMENTS

| | | | |
|---|---|---|---|
| 6,618,414 B1 * | 9/2003 | Wasserbauer et al. ... | 372/45.01 |
| 6,680,963 B2 * | 1/2004 | Liao et al. ................ | 372/96 |
| 6,751,245 B1 * | 6/2004 | Wasserbauer et al. ... | 372/46.01 |
| 6,882,673 B1 * | 4/2005 | Wasserbauer et al. ...... | 372/96 |
| 6,904,072 B2 * | 6/2005 | Cox et al. ............. | 372/46.01 |

OTHER PUBLICATIONS

Michalzik, R. et al.: "High-Bit-Rate Data Transmission with Short-Wavelength Oxidized VCSEL's: Toward Bias-Free Operation", IEEE Journal of Selected Topics in Quantum Electronics, vol. 3, No. 2, Apr. 1997, pp. 396-404.

Zhou, D. et al.: "Simplified-Antiresonant Reflecting Optical Waveguide-Type Vertical-Cavity Surface-Emitting Lasers", American Institute of Physics, Applied Physics Letters, vol. 76, No. 13, Mar. 27, 2000, pp. 1659-1661.

Morgan, R. A. et al.: "Hybrid Dielectric/AlGaAs Mirror Spatially Filtered Vertical Cavity Top-Surface Emitting Laser", American Institute of Physics, Applied Physics Letters, vol. 66, No. 10, Mar. 6, 1995, pp. 1157-1159.

Nishiyama, N. et al.: "Multi-Oxide Layer Structure for Single-Mode Operation in Vertical-Cavity Surface-Emitting Lasers", IEEE Photonics Technology Letters, vol. 12, No. 6, Jun. 2000, pp. 606-609.

* cited by examiner

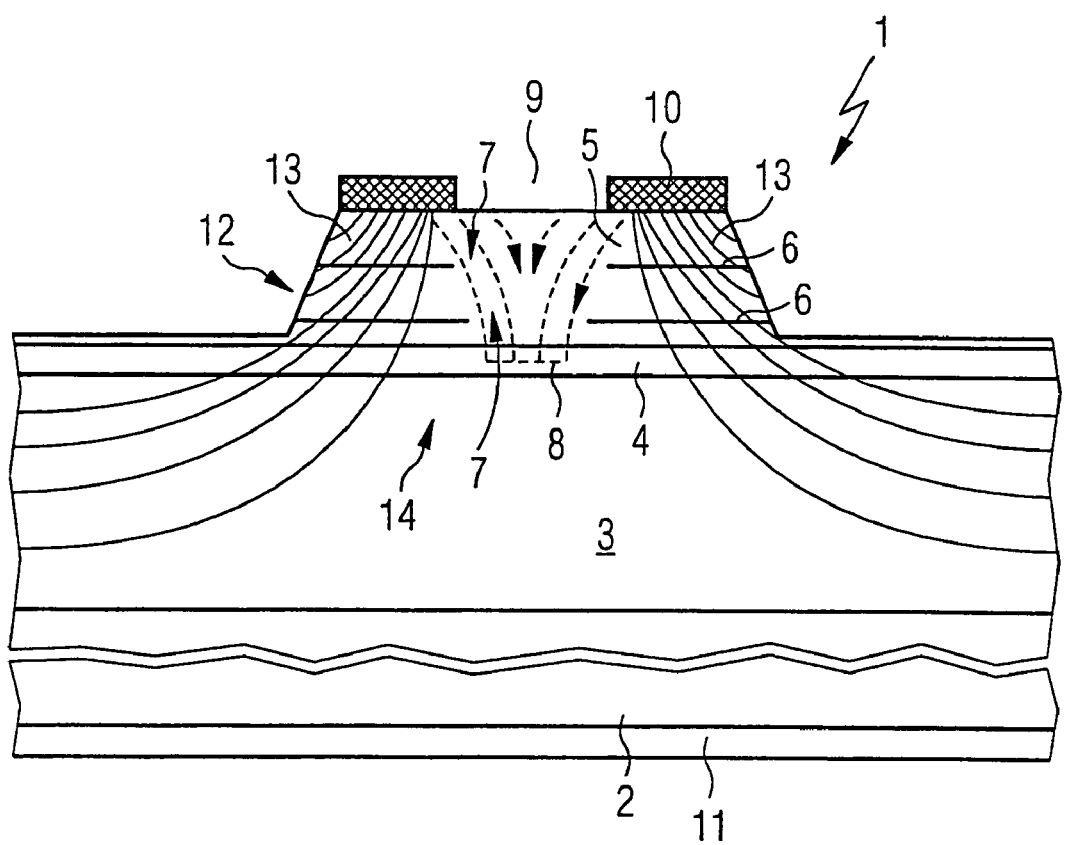

SEMICONDUCTOR LASER

CROSS-REFERENCE TO RELATED APPLICATION

This application is a continuation of copending International Application No. PCT/DE02/00471, filed Feb. 8, 2002, which designated the United States and was not published in English.

BACKGROUND OF THE INVENTION

Field of the Invention

The invention relates to a semiconductor laser having a vertical resonator formed by reflectors, a photon-emitting active layer disposed between the reflectors and a current diaphragm for laterally circumscribing the current flowing through the active layer.

Semiconductor lasers of this type are known as so-called vertical cavity surface-emitting laser (VCSELs). These semiconductor lasers have a layer sequence containing an active layer enclosed between two distributed Bragg reflector (DBR) mirrors. In order to delimit the current injected into the active layer in the lateral direction, provision is made of at least one current diaphragm composed of an oxide in one of the DBR mirrors. The current diaphragms define a current aperture with their inner edge and limit the lateral extent of the pump spot diameter in the active layer.

In principle, monomode operation is also possible with semiconductor lasers of this type. However, this requires a comparatively small pump spot diameter of less than 4 µm, which necessitates a correspondingly small current aperture. However, such small diameters of the current aperture can be produced precisely only with great difficulties. The oxidation is usually affected laterally from the edges of the layer sequence after the layer sequence has been completely deposited. However, this procedure requires accurate knowledge and control of the process parameters.

Moreover, on account of the small current aperture, the known semiconductor lasers with current diaphragms composed of oxide have low optical output powers, high ohmic resistances and high thermal resistances.

SUMMARY OF THE INVENTION

It is accordingly an object of the invention to provide a semiconductor laser that overcomes the above-mentioned disadvantages of the prior art devices of this general type, which is a simple-to-produce monomode semiconductor laser having high optical output power and low ohmic and thermal resistance.

With the foregoing and other objects in view there is provided, in accordance with the invention, a semiconductor laser. The laser contains a vertical resonator formed by reflectors, a photon-emitting active layer disposed between the reflectors, at least one current diaphragm for laterally circumscribing a current flowing through the photon-emitting active layer, and mode-selective regions extending in a vertical direction and laterally delimit the vertical resonator.

The object is achieved according to the invention by virtue of the fact that further mode-selective regions, which extend in the vertical direction and laterally delimit the vertical resonator, are present in addition to the current diaphragm.

The additional mode-selective regions along the axis of the vertical resonator effectively suppress higher modes, since the latter incur higher losses than the fundamental mode in the mode-selective regions. Therefore, only the fundamental mode can reach the laser threshold. At the same time, it is possible to enlarge the current aperture, which, in comparison with the prior art, results in a higher output power and a lower ohmic and thermal resistance.

In a preferred embodiment of the invention, the mode-selective regions are implantation regions with reduced conductivity.

Such implantation regions can also be formed with sufficient precision in a large volume. Moreover, the conductivity can be lowered by use of implantations, thereby attenuating higher-order lateral modes in the implantation regions.

In accordance with an added feature of the invention, a mesa is provided and one of the reflectors is formed in the mesa. The mesa has a diameter of >10 µm.

In accordance with another feature of the invention, the current diaphragm is formed from an oxide.

In accordance with an additional feature of the invention, the current diaphragm defines a current aperture having a given diameter of >3 µm. Additionally, the current diaphragm has a diameter of >4 µm.

In accordance with a further feature of the invention, the mode-selective regions define an inner opening being larger than the current aperture. The mode-selective regions have a conductivity being less than a conductivity of the vertical resonator along a resonator axis. Preferably; the mode-selective regions are implantation regions. The vertical resonator has an edge area and the mode-selective regions extend in the edge area and a surrounding region of the edge area of the vertical resonator.

In accordance with another added feature of the invention, the current diaphragm is at least two current diaphragms.

In accordance with a concomitant feature of the invention, the semiconductor laser has a multilayer structure and the mode-selective regions are formed in the multilayer structure.

Other features which are considered as characteristic for the invention are set forth in the appended claims.

Although the invention is illustrated and described herein as embodied in a semiconductor laser, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a cross-sectional view through a semiconductor laser according to the invention.

DESCRIPTION OF THE PREFERRED EMBODIMENT

Referring now to the single FIGURE of the drawing in detail, there is shown a semiconductor laser 1 having a lower Bragg reflector 3 applied to a substrate 2, a cavity 4 with a photon-emitting active zone being formed on the reflector 3. Situated above the cavity 4 is an upper Bragg reflector 5, in which current diaphragms 6 are formed. An inner edge of the current diaphragms 6 defines current apertures 7 delimiting the lateral extent of the currents injected into the cavity 4. As a result, a photon-emitting pump spot 8 is produced in the cavity 4, which pump spot 8 optically amplifies the radiation reflected between the lower Bragg reflector 3 and the upper Bragg reflector 5. Part of the radiation is allowed to pass by the upper Bragg reflector 5 and can leave the semiconductor laser 1 through an exit opening 9 in an annular front side contact 10. A rear side contact 11 is additionally present on a rear side of the substrate 2.

Generally, the upper Bragg reflector 5 is configured as a mesa 12. Situated in edge regions of the mesa 12 are implantation regions as mode-selective regions 13, which also extend into the substrate 2. The mode-selective regions 13 have an inner opening 14. The cross-sectional area of the inner opening 14 is always larger than the area of the current apertures 7.

By implantation, the conductivity of the material in the mode-selective regions 13 is less than the conductivity in the inner opening 14 of the mode-selective regions 13. Higher-order modes that extend into the mode-selective regions 13 are therefore attenuated. An optical amplification takes place only in the region of the inner opening 14, that is to say in the region of the fundamental mode. Therefore, the diameter of the current apertures 7 can be chosen to be larger than in the prior art.

The larger opening of the current apertures 7 in comparison with the prior art leads to a lower series resistance of the semiconductor laser 1, and to a lower thermal resistance, which results in weaker ageing effects. Moreover, the large current apertures 7 lead to a large pump spot 8 and thus to higher optical output powers. The inner diameter of the current apertures 7 is more than 3 μm, preferably more than 4 μm, in the semiconductor laser 1.

What is also particularly advantageous is that the production of the current diaphragms 6 can be controlled better in comparison with the prior art, since the production-dictated deviations during the production of the current diaphragms 6 are smaller as seen in relative terms.

The double embodiment of the current diaphragms 6 furthermore makes it possible to avoid excessive edge elevations of the current injection into the cavity 4 which intrinsically also jeopardize the monomode nature.

The invention described here is not restricted to specific materials. The known materials that can be used for the type of semiconductor lasers 1 described can be considered. The customary methods known to the person skilled in the art are suitable for production.

I claim:

1. A semiconductor laser, comprising:
   a vertical resonator formed by reflectors;
   a photon-emitting active layer disposed between said reflectors;
   at least one current diaphragm for laterally circumscribing a current flowing through said photon-emitting active layer; and
   mode-selective regions extending in a vertical direction within said vertical resonator and laterally delimiting said vertical resonator, said mode-selective regions being implantation regions extending into said photon-emitting active layer.

2. The semiconductor laser according to claim 1, further comprising a mesa and one of said reflectors is formed in said mesa.

3. The semiconductor laser according to claim 2, wherein said mesa has a diameter of >10 μm.

4. The semiconductor laser according to claim 1, wherein said current diaphragm is formed from an oxide.

5. The semiconductor laser according to claim 1, wherein said current diaphragm defines a current aperture having a given diameter of >3 μm.

6. The semiconductor laser according to claim 5, wherein said current diaphragm has a diameter of >4 μm.

7. The semiconductor laser according to claim 5, wherein said mode-selective regions define an inner opening being larger than said current aperture.

8. The semiconductor laser according to claim 1, wherein said mode-selective regions have an electrical conductivity less than an electrical conductivity of said vertical resonator along a resonator axis.

9. The semiconductor laser according to claim 1, wherein said vertical resonator has an edge area and said mode-selective regions extend in said edge area and a surrounding region of said edge area of said vertical resonator.

10. The semiconductor laser according to claim 1, wherein said current diaphragm is at least two current diaphragms.

11. The semiconductor laser according to claim 1, wherein the semiconductor laser has a multilayer structure and said mode-selective regions are formed within said multilayer structure.

12. A semiconductor laser, comprising:
    a substrate;
    a vertical resonator formed by reflectors;
    a photon-emitting active layer disposed between said reflectors;
    at least one current diaphragm for laterally circumscribing a current flowing through said photon-emitting active layer; and
    mode-selective regions extending in a vertical direction within said vertical resonator and laterally delimiting said vertical resonator, said mode-selective regions being implantation regions extending into said substrate.

* * * * *